United States Patent [19]
Yamada et al.

[11] Patent Number: 5,462,775
[45] Date of Patent: Oct. 31, 1995

[54] METHOD OF PRODUCING HARD MULTILAYER FILM FORMED MATERIAL

[75] Inventors: Minoru Yamada, Kurobe; Shingo Kawamura, Toyama, both of Japan

[73] Assignee: Yoshida Kogyo K.K., Tokyo, Japan

[21] Appl. No.: 399,641

[22] Filed: Mar. 7, 1995

Related U.S. Application Data

[62] Division of Ser. No. 90,924, Jul. 14, 1993.

[30] Foreign Application Priority Data

Jul. 7, 1992 [JP] Japan .................................. 4-205042

[51] Int. Cl.$^6$ .................................................. B05D 3/06
[52] U.S. Cl. ..................... 427/573; 427/249; 427/255.7; 427/294; 427/419.7; 427/574; 427/577; 427/578; 427/585
[58] Field of Search ...................... 427/573, 249, 427/255.7, 294, 419.7, 574, 577, 578, 585

[56] References Cited

U.S. PATENT DOCUMENTS

| | | | |
|---|---|---|---|
| 3,787,223 | 1/1974 | Reedy, Jr. | 428/627 |
| 4,525,415 | 6/1985 | Porat | 428/216 |
| 4,686,156 | 8/1987 | Baldoni, II et al. | 428/698 |
| 4,728,579 | 3/1988 | König | 428/472 |
| 4,731,302 | 3/1988 | Weissmantel et al. | 428/698 |
| 4,895,765 | 1/1990 | Sue et al. | 428/627 |
| 4,917,961 | 4/1990 | Tsujii et al. | 428/552 |
| 5,071,693 | 12/1991 | Sue et al. | 428/212 |
| 5,185,211 | 2/1993 | Sue et al. | 428/472 |
| 5,223,337 | 6/1993 | van den Berg et al. | 428/336 |
| 5,249,554 | 10/1993 | Tamor et al. | 123/90.51 |
| 5,260,107 | 11/1993 | Kawamura et al. | 427/577 |
| 5,266,389 | 11/1993 | Omori et al. | 428/216 |
| 5,266,409 | 11/1993 | Schmidt et al. | 428/446 |

FOREIGN PATENT DOCUMENTS

| | | |
|---|---|---|
| 0193998 | 9/1986 | European Pat. Off. . |
| 0229936 | 7/1987 | European Pat. Off. . |
| 0446988 | 9/1991 | European Pat. Off. . |
| 2596775 | 10/1987 | France . |
| 4211829A1 | 11/1992 | Germany . |

OTHER PUBLICATIONS

6178 Diamond and Related Materials 2 (1993) Mar. 31, Nos. 2/4, Lausanne, CH.
Abstract of JP-A-59 025 973. (no date avail.).
Abstract of JP-A-63 286 576. (no date avail.).
Dialog Abstract for FR 2 596 775 as of Jun. 3, 1994.

*Primary Examiner*—Bernard Pianalto
*Attorney, Agent, or Firm*—Hill, Steadman & Simpson

[57] ABSTRACT

A hard multilayer film structure comprises a titanium-containing compound layer possessing high wear resistance deposited on a substrate and a silicon-containing hard carbon layer possessing self-lubricating properties, high wear resistance and high resistance to heat. Deposition of these layers is effected by the plasma-enhanced chemical vapor deposition technique. As a raw gas for the deposition of silicon-containing hard carbon-layer, the gas containing tetramethyl silane or tetraethyl silane is used. Deposition of the silicon-containing hard carbon layer is carried out at a temperature of not more than 550° C. and a pressure in the range of 0.05 to 0.5 Torr.

7 Claims, 1 Drawing Sheet

METHOD OF PRODUCING HARD MULTILAYER FILM FORMED MATERIAL

This is a division, of application Ser. No. 08/090,924, filed Jul. 14, 1993.

BACKGROUND OF THE INVENTION

1. Field of the Invention

This invention relates to a hard multilayer film formed material improved in resistance to wear, self-lubricating properties, and resistance to heat and a method for the production thereof. This invention is applicable to tools, molds, machine parts and the like.

2. Description of the Prior Art

Heretofore, TiC or TiN coating have been employed for the purpose of vesting tools, molds, and machine parts with improved wear resistance. These hard films of titanium-containing compound have good resistance to wear. They, however, are deficient in self-lubricating properties and more often than not liable to adhere fast to such an active metal as aluminum in the absence of lubrication. On the other hand, an amorphous carbon film is hard and, moreover, has self-lubricating properties. It nevertheless is deficient in ability to adhere fast to a substrate and, therefore, is apt to induce separation. When a hard amorphous carbon film is formed elaborately on TiC or TiN layer, separation often happens between TiC or TiN layer and the hard amorphous carbon film either during or immediately after the formation of the film because the hard amorphous carbon has large internal stress and poor matching property with TiC or TiN. When the composite structure of TiC or TiN layer and hard amorphous carbon film incorporates a layer containing TiC or other titanium-containing compound as an intermediate layer therein, it fits uses subject to only light load and uses for decorative purposes but proves impractical for common uses demanding self-lubricating properties and resistance to wear because no sufficient adhesion exists between the intermediate layer and the hard amorphous carbon layer.

SUMMARY OF THE INVENTION

The present invention, therefore, has an object of providing a material coated with a hard multilayer film which manifests resistance to heat as well as self-lubricating properties and resistance to wear and, moreover, enjoys good adhesiveness and hardly suffers from separation.

Another object of the present invention is to provide a method which allows easy production of the hard multilayer film structure mentioned above.

To accomplish the objects described above, in accordance with the present invention, there is provided a hard multilayer film coated material which comprises a substrate and a multilayer film including a hard wear-resistant film of a titanium-containing compound coated on the surface of said substrate and a hard carbon layer containing silicon.

To produce the hard multilayer film structure, the present invention utilizes an improved plasma-enhanced chemical vapor deposition (plasma CVD) process. The process includes the steps of setting a substrate in place inside a vacuum chamber, depositing a hard wear-resistant layer of a titanium-containing compound on said substrate by the plasma CVD technique at a temperature in the range of about 400° C. to about 550° C., and then introducing into said chamber a raw gas containing a tetraalkyl silane such as tetramethyl silane and tetraethyl silane to deposit a silicon-containing hard carbon layer on said wear-resistant layer by the plasma CVD technique at a substrate temperature of not more than 550° C. and a pressure in the range of 0.05 to 0.5 Torr.

BRIEF DESCRIPTION OF THE DRAWINGS

Other objects, features, and advantages of the invention will become apparent from the following description taken together with the drawings, in which.

DETAILED DESCRIPTION OF THE INVENTION

A hard multilayer film coated material according to the present invention comprises a substrate and a multilayer film including a hard wear-resistant film of a titanium-containing compound coated on the surface of the substrate and a hard carbon layer containing silicon.

Figure 1:
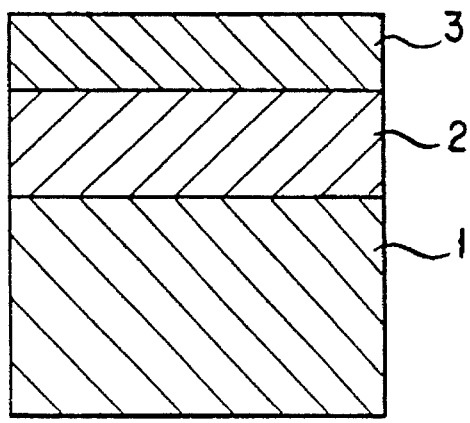
FIG. 1 is a fragmentary cross-sectional view illustrating the layer construction of a hard multilayer film deposited on a substrate by use of the method of the present invention.

The typical layer construction of the hard multilayer film structure is shown in FIG. 1, wherein the numeral 1 stands for the substrate, 2 for the hard wear-resistant film of the titanium-containing compound (for example, TIC), and 3 for the hard carbon film containing silicon.

The layers 2 and 3 are formed severally by the plasma CVD technique. The hard wear-resistant layer 2 of the titanium-containing compound is formed of TiC or TiN, for example, and is intended to furnish the structure with resistance to wear. The thickness of the hard titanium-containing compound layer 2 is suitably in the range of 0.5 to 5.0 μm. The silicon-containing hard carbon layer 3 is vested with self-lubricating properties, resistance to wear, and resistance to heat. The Si content of the hard carbon layer 3 is suitably in the range of 5 to 40 atomic percent, preferably 20 to 40 atomic percent. If the Si content is less than 5 atomic percent, the hard carbon layer 3 exhibits no sufficient adhesiveness to the underlying titanium-containing compound layer. If the Si content exceeds 40 atomic percent, then the hard carbon layer 3 impairs the self-lubricating function of the structure. The thickness of the silicon-containing hard carbon layer 3 is suitably in the range of 0.5 to 4.0 μm.

A method of the present invention for producing the hard multilayer film structure mentioned above includes the steps of:

(a) setting a substrate in place inside a vacuum chamber,
(b) introducing a raw gas containing the sources of titanium-containing compound into the chamber,
(c) depositing the hard wear-resistant layer of the titanium-containing compound on the substrate by the plasma CVD technique at a substrate temperature in the range of about 400° C. to about 550° C.,
(d) then introducing into the chamber a raw gas containing tetramethyl silane or tetraethyl silane alone or in combination with a hydrocarbon and/or hydrogen, and
(e) depositing the silicon-containing hard carbon layer on the wear-resistant layer by the plasma CVD technique at a substrate temperature of not more than 550° C. and a pressure of 0.05 to 0.5 Torr.

In the procedure decribed above, the temperature for forming the hard carbon film is preferably in the range of 400° C. to 550° C. from the viewpoint of diffusion of the component elements of the film.

In general, when a film of a titanium-containing compound such as TiC is formed by the plasma CVD process, unless the ratio of the amount of $CH_4$ to the amount of $H_2$ ($TiCl_4$) as a carrier gas are set below a certain value (approximately 0.02 at 20° C., the temperature of a $TiCl_4$ vaporizer), namely the amount of $CH_4$ is controlled below a certain level, the edge part of the substrate is suffered to form graphite of poor adhesiveness and the edge part is not easily coated sufficiently with TiC film especially if the substrate to be coated happens to have a three-dimensional shape. Further, the film suffers from inclusion therein of a large amount of residual chlorine unless it is formed at an elevated temperature, for example in the neighborhood of 500° C. If the residual chlorine content in the film exceeds 5 atomic percent, the residual chlorine produces an adverse effect on the characteristic properties of the film (such as self-lubricating properties and resistance to wear). Thus, in the step (c) mentioned above the titanium-containing compound film is deposited on the substrate heated to a temperature of about 400° C. to about 550° C. During the deposition of titanium-containing compound, the pressure within the deposition chamber is kept at a reduced pressure, preferably at the same pressure as that employed for the deposition of silicon-containing carbon layer. To deposit TiN film, a suitable source of nitrogen such as $N_2$ gas is additionally incorporated into tile aforementioned raw gas.

In accordance with the method of the present invention, a raw gas containing tetramethyl silane or tetraethyl silane alone or in combination with hydrocarbon and/or hydrogen is employed to deposit the silicon-containing carbon layer. The tetramethyl silane or tetraethyl silane is a compound having four methyl groups or ethyl groups bonded to a silicon atom. Since this compound has the silicon atom coupled to carbon atoms already in the state of a raw material gas, it is characterized in that it allows ready uniform dispersion of silicon in carbon and forms graphite consisting solely of carbon bonds in the edge parts of the substrate at elevated temperatures only with great difficulty. Further, since the film is grown at elevated temperatures in the range of 400° C. to 550° C., the component elements of the film are mutually diffused and consequently enabled to strongly join the silicon-containing hard carbon layer to the underlying titanium-containing compound layer without requiring interposition therebetween of an intermediate layer for the purpose of enhancing the adhesiveness, such as an amorphous carbon layer containing a titanium-containing compound whose content is gradually decreased toward the surface thereof. Unlike the conventional technique using a hydrocarbon like $CH_4$ as a source of carbon in the raw gas and consequently suffering easily from formation of graphite in the edge part of the substrate owing to the local concentration of discharge in the edge part under a relatively high pressure during the deposition of film, the present invention is enabled by the use of tetramethyl silane or tetraethyl silane to produce a hard carbon film without formation of graphite at a pressure falling in a wide range of 0.05 to 0.5 Torr. In this case, when the tetramethyl silane or tetraethyl silane is used as mixed with a hydrocarbon like methane, the mixing ratio of carbon and silicon in the hard carbon film can be easily controlled under fixed conditions of pressure, temperature, etc. by suitably changing the ratio of the flow rates of tetramethyl silane or tetraethyl silane and the hydrocarbon. The addition of hydrogen into the raw gas is effective to control the pressure inside the vacuum chamber and support the plasma discharge during the growth of film. Further, it is known that the frictional wear characteristics of the hard carbon film are influenced by the hydrogen content in the film. Thus, the frictional wear characteristics of the hard carbon film can be controlled by adjusting the hydrogen content in the hard carbon film.

Generally, when a hydrocarbon like $CH_4$ is used as a source of carbon in the raw gas, the produced film suffers from persistence therein of large residual stress if the pressure during the growth of film is low and the residual stress possibly forms a cause for separation of carbon film. This invention enables the residual stress in the hard carbon film to be repressed because it permits the film to be grown at such a high pressure as mentioned above.

Moreover, since the hard carbon film of this invention is grown at a high temperature up to 550° C., it is stable and manifests outstanding resistance to heat under conditions of actual use involving a temperature even exceeding 400° C.

Since the reaction gases which are used during the doposition of the hard carbon film are invariably formed of the component elements of the film, there is no possibility of the produced hard carbon film entrapping therein such impurities as chlorine which would occur when the film is formed by using $TiCl_4$.

The present invention does not prohibit an intermediate carbon layer containing a titanium-containing compound with inclined content therein being interposed between the titanium-containing compound layer 2 and the silicon-containing hard carbon layer 3 shown in FIG. 1. This intermediate layer is formed of a hard amorphous carbon film containing the titanium-containing compound whose content is gradually decreased toward the surface thereof and serves the purpose of enhancing the adhesiveness of the hard carbon layer to the titanium-containing compound layer, as disclosed in copending U.S. application Ser. No. 861,246 of Kawamura et al. filed Mar. 31, 1992, assigned to the same assignee as the present invention, and the corresponding German patent application No. 42 11 829.8 (Publication No. 42 11 829), the teachings thereof are hereby incorporated by reference.

Now, the present invention will be described more specifically below with reference to working examples.

Figure 2:
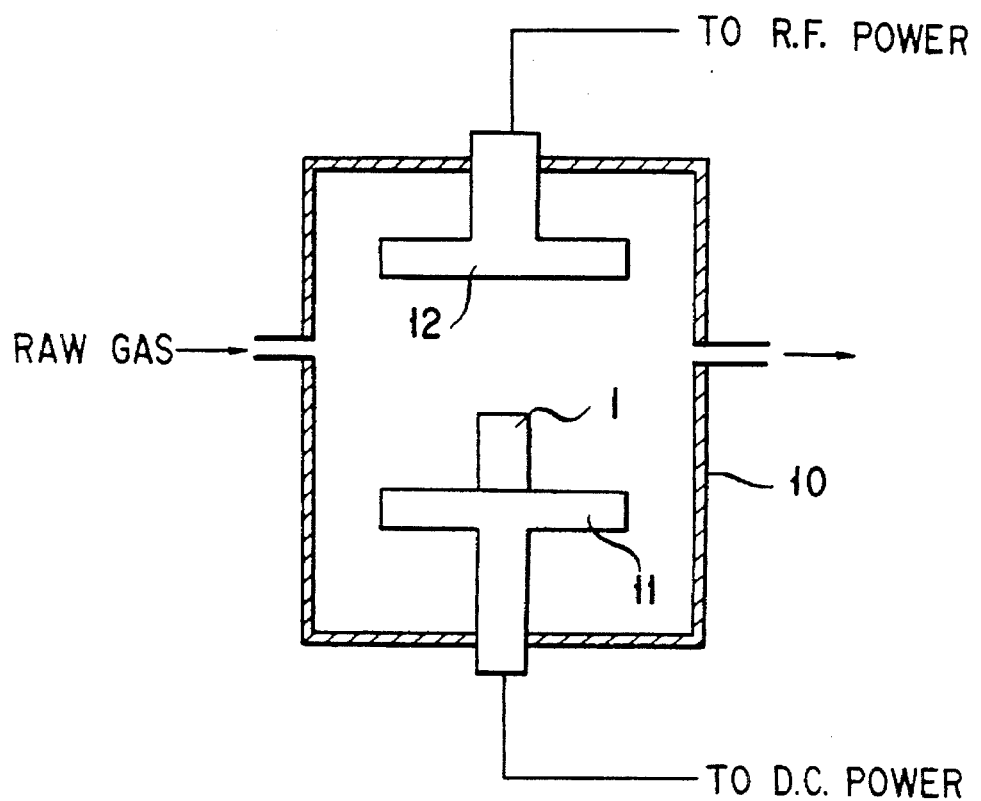
FIG. 2 is a schematic representation of a plasma CVD system to be used for the production of the hard multilayer film structure according to the present invention.

In a plasma CVD system constructed as shown in FIG. 2, a substrate 1 of high speed tool steel [JIS (Japanese Industrial Standard) SKH51] was set in place on a DC electrode 11 disposed inside the chamber 10, and the substrate was kept at a temperature of 500° C. and a discharge electrode 12 was caused to generate RF discharge under the conditions of gas flow ratio, $CH_4/H_2$ ($TiCl_4$), of 0.02 and pressure of 0.3 Torr to deposit a TiC film 2 of a thickness of 2.0 μm on the substrate 1 as shown in FIG. 1. Thereafter, the reaction gases were switched to tetramethyl silane and hydrogen and the system was continuously operated under the conditions of substrate temperature of 500° C. and pressure of 0.3 Torr to deposit a silicon-containing hard carbon film 3 in a thickness of 1 μm.

In the produced multilayer film structure, no sigh of graphitization was found in the edge part of the substrate. The formed carbon film was found to have Knoop hardness of 1,500 (25 gf). In the evaluation by a scratch test, it was found to have Lc value of 30 (N).

The hard multilayer film structure obtained was not found to induce layer separation even when the deposition of film was effected under high pressure. It was found to have the multilayer film of the construction described above deposited with ample adhesiveness on the substrate. In a heating test conducted on tile product, no graphitization of the carbon film proceeded at temperatures up to 550° C.

The data of the sample mentioned above and the other multilayer film structures produced are shown in the following table.

TABLE

| Thickness of film | | Contents in hard carbon film of | | Lc value | Friction | |
|---|---|---|---|---|---|---|
| TiC | Hard carbon | | | | | |
| (μm) | (μm) | C (%) | Si (%) | (N) | coefficient | Remark |
| 2.0 | 1.0 | 70 | 30 | 30 | 0.1 | |
| 0.8 | 0.8 | 70 | 30 | 23 | 0.1 | |
| 0.8 | 0.8 | 50 | 50 | 17 | 0.5 | |
| 0.8 | 0.8 | 97 | 3 | — | — | Separation occurred between TiC film and hard carbon film |

Since the silicon-containing hard carbon film in the multilayer film structure according to the present invention was formed at a relatively high temperature, it prevented the otherwise possible occurrence of graphitization until a high temperature and proved itself to be highly resistance to heat.

As mentioned above, the present invention enables the underlying titanium-containing compound (TiC or TiN) layer to confer wear resistance and the overlying hard carbon layer containing silicon to confer self-lubricating properties and wear resistance respectively on the produced hard multilayer film structure. Moreover, these layers adhere very fast to each other and will not easily separate. Therefore, when the hard multilayer film structure according to the present invention is used as a sliding surface of a machine part which operates in the absence of lubrication, for example, even after the silicon-containing hard carbon film has been worn out, the second hard wear-resistant layer of titanium-containing compound can prevent the otherwise possible mutual adhesion of the metal surfaces by seizing.

The invention may be embodied in other specific forms without departing from the spirit or essential characteristics thereof. The described embodiments are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. A method for the production of a hard multilayer film coated material, which comprises the steps of:

setting a substrate in place inside a vacuum chamber, depositing a hard wear-resistant layer of a titanium-containing compound on said substrate by a plasma-enhanced chemical vapor deposition process at a temperature in the range of about 400° C. to about 550° C. and introducing into said chamber a raw gas containing a tetraalkyl silane selected from the group consisting of tetramethyl silane and tetraethyl silane to deposit a silicon-containing hard carbon layer on said wear-resistant layer by the plasma-enhanced chemical vapor deposition process at a substrate temperature of not more than 550° C. and a pressure in the range of 0.05 to 0.5 Torr.

2. A method according to claim 1, wherein the gas containing tetraalkyl silane further contains a hydrocarbon.

3. A method according to claim 1, wherein the gas containing tetraalkyl silane further contains hydrogen.

4. A method according to claim 1, wherein the substrate is kept at a temperature in the range of 400° C. to 550° C. during the deposition of the silicon-containing hard carbon layer.

5. A method according to claim 1, wherein the titanium-containing compound is titanium carbide.

6. A method according to claim 1, wherein the titanium-containing compound is titanium nitride.

7. A method according to claim 1, wherein the deposition of the hard wear-resistant layer of titanium-containing compound on the substrate and the subsequent deposition of the silicon-containing hard carbon layer are effected at the same substrate temperature in the range of 400° C. to 550° C. and the same pressure in the range of 0.05 to 0.5 Torr.

* * * * *

UNITED STATES PATENT AND TRADEMARK OFFICE
CERTIFICATE OF CORRECTION

PATENT NO. : 5,462,775
DATED : Oct. 31, 1995
INVENTOR(S) : Minoru Yamada, et al

It is certified that error appears in the above-indentified patent and that said Letters Patent is hereby corrected as shown below:

On title page, item [30], please change "Jul. 7, 1992" to

--Jul. 31, 1992--.

Signed and Sealed this

Twenty-seventh Day of February, 1996

Attest:

BRUCE LEHMAN

*Attesting Officer*            *Commissioner of Patents and Trademarks*